United States Patent
Su et al.

(10) Patent No.: US 10,516,250 B1
(45) Date of Patent: Dec. 24, 2019

(54) NEAR-INFRARED VERTICAL-CAVITY SURFACE-EMITTING LASER AND TRANSFER METHOD THEREOF

(71) Applicant: EPILEDS TECHNOLOGIES, INC., Tainan (TW)

(72) Inventors: Wen-Herng Su, Beigang Township, Yunlin County (TW); Ming-Sen Hsu, Tainan (TW)

(73) Assignee: EPILEDS TECHNOLOGIES, INC., Tainan (TW)

( * ) Notice: Subject to any disclaimer, the term of this patent is extended or adjusted under 35 U.S.C. 154(b) by 0 days.

(21) Appl. No.: 16/285,893

(22) Filed: Feb. 26, 2019

(30) Foreign Application Priority Data

Oct. 24, 2018 (TW) .............................. 107137477 A

(51) Int. Cl.
  *H01S 5/183* (2006.01)
  *H01S 5/042* (2006.01)
  *H01S 5/24* (2006.01)
  *H01S 5/022* (2006.01)

(52) U.S. Cl.
  CPC .......... *H01S 5/0421* (2013.01); *H01S 5/0226* (2013.01); *H01S 5/0425* (2013.01); *H01S 5/18377* (2013.01); *H01S 5/24* (2013.01)

(58) Field of Classification Search
  CPC .... H01S 5/0226; H01S 5/0425; H01S 5/0421; H01S 5/18377; H01S 5/24
  USPC .................................. 372/38.05, 50.11, 102
  See application file for complete search history.

(56) References Cited

U.S. PATENT DOCUMENTS

| 6,549,556 B1* | 4/2003 | Hwang ............... H01S 5/18341 372/43.01 |
| 2004/0076209 A1* | 4/2004 | Bour ..................... B82Y 20/00 372/45.01 |
| 2006/0285566 A1* | 12/2006 | Ueki ...................... B82Y 20/00 372/45.01 |

FOREIGN PATENT DOCUMENTS

| TW | 200943653 A | 10/2009 |
| TW | 201830811 A | 8/2018 |

* cited by examiner

*Primary Examiner* — Tuan N Nguyen
(74) *Attorney, Agent, or Firm* — Muncy, Geissler, Olds & Lowe, P.C.

(57) ABSTRACT

A near-infrared vertical-cavity surface-emitting laser is provided, which utilizes a conventional distributed Bragg reflector and a complex Bragg reflector which consists of a dielectric Bragg reflector and a reflective metal layer to construct a cavity. With the disposition of a confining layer, the light emitted from an active layer is confined in the cavity to resonate so as to emit a laser light. The thickness of the complex Bragg reflector is much thinner than that of the conventional distributed Bragg reflector, thereby lowering the cost of manufacture. In addition, with the transfer method, the laser is transferred to the substrate with high thermal conductivity to increase the heat dissipation efficiency. Therefore, the present invention can maintain operation while emitting a high-power laser.

34 Claims, 10 Drawing Sheets

NEAR-INFRARED VERTICAL-CAVITY SURFACE-EMITTING LASER AND TRANSFER METHOD THEREOF

CROSS-REFERENCE TO RELATED APPLICATION

This application claims priority from Taiwan Patent Application No. 107137477, filed on Oct. 24, 2018 in Taiwan Intellectual Property Office, the disclosures of which are hereby incorporated by reference in their entirety for all purposes.

BACKGROUND OF THE INVENTION

1. Field of the Invention

The present invention relates to a near-infrared vertical-cavity surface-emitting laser and a transfer method thereof capable of minimizing the size of a laser element and reducing manufacturing cost by using a conventional distributed Bragg reflector and a complex Bragg reflector to construct a cavity.

2. Description of the Related Art

Lasers are becoming more and more common and are more often applied to medical, optical communications, and industrial processing as technology advances. Nevertheless, oversized lasers are considered a significant drawback. Accordingly, it is often necessary to consider the size of space in terms of the placement of the laser. Manufacturers have recently developed semiconductor lasers to tackle the problem of lasers being oversized. A vertical cavity surface emitting laser has drawn a great deal of attention owing to a low threshold current and a short cavity length. However, manufacturing costs may increase due to complex structures of the vertical cavity surface emitting laser. Hence, the improvement in the structures of the vertical cavity surface emitting laser will definitely make the vertical cavity surface emitting laser cater to the need for the laser market.

The U.S. Pat. No. 6,549,556B1 has disclosed using a dielectric Bragg reflector and a metal mirror to form a cavity. However, it seems difficult to achieve the aim of high quality laser by only relying on an insulating layer under an electrode and a semiconductor laminated layer to confine the current flow route and the emitting direction of laser.

Accordingly, the inventor of the present invention has designed a near-infrared vertical-cavity surface-emitting laser and a transfer method thereof to overcome deficiencies in terms of current techniques so as to enhance the implementation and application in industries.

SUMMARY OF THE INVENTION

In view of the aforementioned problems, the present invention aims to provide a near-infrared vertical-cavity surface-emitting laser and a transfer method thereof to solve the problems encountered in prior art.

On the basis of the purpose as mentioned above, the present invention provides a near-infrared vertical-cavity surface-emitting laser including a domestic substrate, an epitaxial layer, a n-type contact layer, a n-type distributed Bragg reflector, a n-type confining layer, an active layer, a p-type confining layer, a p-type contact layer, at least one trench, a complex Bragg reflector, and a contact metal layer. The stacking order of the domestic substrate to the p-type contact layer of the near-infrared vertical-cavity surface-emitting laser is from the domestic substrate to the p-type contact layer. For array configuration, each of the trenches is alternately disposed in the p-type contact layer. Every two of each of the trenches define a light-emitting unit. The plurality of complex Bragg reflectors are disposed on the p-type contact layer, and each of complex Bragg reflectors is alternately disposed between each of the trenches. The plurality of contact metal layers are disposed on the p-type contact layer, and each of the contact metal layers is disposed between each of the trenches and each of the complex Bragg reflectors. The light-emitting area of the present invention is confined through the cavity formed by the n-type distributed Bragg reflector and the complex Bragg reflector and with the collocation of the n-type confining layer and the p-type confining layer, which allows the light generated from the active layer to resonate in the cavity so as to generate laser.

Preferably, each of the complex Bragg reflectors includes a Bragg reflector and a reflective metal layer. The Bragg reflector is disposed on the p-type contact layer and made of a dielectric material. The reflective metal layer is disposed on the Bragg reflector.

Preferably, the near-infrared vertical-cavity surface-emitting laser of the present invention further includes at least one aperture layer. Each of the aperture layers is disposed between the p-type contact layer and the active layer and/or between the n-type distributed Bragg reflector and the active layer.

Preferably, the n-type confining layer and the p-type confining layer respectively include a spacing layer to adjust the length of the cavity, and the p-type contact layer includes a current spreading layer.

Preferably the near-infrared vertical-cavity surface-emitting laser of the present invention further includes a back electrode and a connecting metal band. The back electrode is disposed under the domestic substrate. The connecting metal band is disposed on each of the reflective metal layers, each of the contact metal layers, each of the trenches, and the interval between each of the trenches in order to connect the electrode of each of the light-emitting units.

Preferably, an insulating layer is disposed in each of the trenches, over the interval between each of the trenches, in the interval between every two contact metal layers, and in the interval between every two light-emitting units.

On the basis of the purpose as mentioned above, the present invention provides a near-infrared vertical-cavity surface-emitting laser including a domestic substrate, an epitaxial layer, a n-type contact layer, a n-type distributed Bragg reflector, a n-type confining layer, an active layer, a p-type confining layer, a p-type contact layer, a transparent conductive oxide layer, at least one trench, a complex Bragg reflector, and a contact metal layer. The stacking order of the domestic substrate to the transparent conductive oxide layer of the near-infrared vertical-cavity surface-emitting laser is from the domestic substrate to the transparent conductive oxide layer. For array configuration, each of the trenches is alternately disposed in the transparent conductive oxide layer. Every two of each of the trenches define a light-emitting unit. The plurality of complex Bragg reflectors are disposed on the transparent conductive oxide layer, and each of the plurality of complex Bragg reflectors is alternately disposed between each of the trenches. The plurality of contact metal layers are disposed on the transparent conductive oxide layer, and each of the contact metal layers is disposed between each of the trenches and each of the complex Bragg reflectors. The light-emitting area of the present invention is confined and the current applied to the present invention may uniformly spread through the cavity formed by the n-type distributed Bragg reflector and the complex Bragg reflector and with the collocation of the transparent conductive oxide layer, the n-type confining layer and the p-type confining layer, which allows the light generated from the active layer to resonate in the cavity so as to generate laser.

Preferably, each of the complex Bragg reflectors includes a first Bragg reflector, a second Bragg reflector, and a reflective metal layer. The first Bragg reflector is disposed on the transparent conductive oxide layer. The second Bragg reflector is disposed on the first Bragg reflector. The reflective metal layer is disposed on the second Bragg reflector. Both the first Bragg reflector and the second Bragg reflector are made of a dielectric material.

Preferably, the near-infrared vertical-cavity surface-emitting laser of the present invention further includes at least one aperture layer. Each of the aperture layers is disposed between the p-type contact layer and the active layer and/or between the n-type distributed Bragg reflector and the active layer.

Preferably, the n-type confining layer and the p-type confining layer respectively include a spacing layer to adjust the length of the cavity, and the p-type contact layer includes a current spreading layer.

Preferably, the near-infrared vertical-cavity surface-emitting laser of the present invention further includes a back electrode and a connecting metal band. The back electrode is disposed under the domestic substrate. The connecting metal band is disposed on each of the reflective metal layers, each of the contact metal layers, each of the trenches, and the interval between each of the trenches in order to connect the electrode of each of the light-emitting units.

Preferably, an insulating layer is disposed in each of the trenches, over the interval between each of the trenches, in the interval between every two contact metal layers, and in the interval between every two light-emitting units.

Preferably, the transparent conductive oxide layer includes materials based on indium tin oxide (ITO), zinc oxide (ZnO), aluminum-doped zinc oxide (AZO) or zinc tin oxide (SnZnO).

On the basis of the purpose as mentioned above, the present invention provides a near-infrared vertical-cavity surface-emitting laser including a carrier substrate, a bonding metal layer, a barrier layer, an adhesive layer, a plurality of complex Bragg reflectors, at least one trench, a plurality of contact metal layers, a plurality of semiconductor structures, a n-type distributed Bragg reflector, and a n-type contact layer. The bonding metal layer is disposed on the carrier substrate. The barrier layer is disposed on the bonding metal layer. The adhesive layer is disposed on the barrier layer. The plurality of complex Bragg reflectors are alternately disposed on the adhesive layer. Each of the trenches is disposed between each of the complex Bragg reflectors. The plurality of contact metal layers are alternately disposed between each of the trenches and each of the complex Bragg reflectors. The plurality of semiconductor structures are disposed between each of the trenches and positioned on each of the complex Bragg reflectors and each of the contact metal layers. The n-type distributed Bragg reflector is disposed on each of the trenches and each of the semiconductor structures. The n-type contact layer is disposed on the n-type distributed Bragg reflector.

Preferably, each of the semiconductor structures includes a p-type contact layer, a p-type confining layer, an active layer, and a n-type confining layer. The p-type contact layer is disposed on each of the complex Bragg reflectors and each of the contact metal layers. The p-type confining layer is disposed on the p-type contact layer. The active layer is disposed on the p-type confining layer. The n-type confining layer is disposed on the active layer.

Preferably, each of the complex Bragg reflectors includes a Bragg reflector and a reflective metal layer. The Bragg reflector is disposed under the p-type contact layer and made of a dielectric material. The reflective metal layer is disposed under the Bragg reflector.

Preferably, each of the semiconductor structures includes a transparent conductive oxide layer, a p-type contact layer, a p-type confining layer, an active layer, and a n-type confining layer. The transparent conductive oxide layer is disposed on each of the complex Bragg reflectors and each of the contact metal layers. The p-type contact layer is disposed on the transparent conductive oxide layer. The p-type confining layer is disposed on the p-type contact layer. The active layer is disposed on the p-type confining layer. The n-type confining layer is disposed on the active layer.

Preferably, each of the complex Bragg reflectors includes a first Bragg reflector, a second Bragg reflector, and a reflective metal layer. The second Bragg reflector is disposed under the transparent conductive oxide layer. The first Bragg reflector is disposed under the second Bragg reflector. The reflective metal layer is disposed under the first Bragg reflector. Both the first Bragg reflector and the second Bragg reflector are made of a dielectric material.

Preferably, the transparent conductive oxide layer includes materials based on indium tin oxide (ITO), zinc oxide (ZnO), aluminum-doped zinc oxide (AZO) or zinc tin oxide (SnZnO).

Preferably, the near-infrared vertical-cavity surface-emitting laser of the present invention further includes at least one aperture layer. Each of the aperture layers is disposed between the p-type contact layer and the active layer and/or between the n-type distributed Bragg reflector and the active layer.

Preferably, the n-type confining layer and the p-type confining layer respectively include a spacing layer to adjust the length of the cavity, and the p-type contact layer includes a current spreading layer.

Preferably, the near-infrared vertical-cavity surface-emitting laser of the present invention further includes at least one n-type metal electrode, at least one bonding pad, and a back electrode. Each of the n-type metal electrodes is disposed on the n-type contact layer. Each of the bonding pads is disposed on at least one of the n-type metal electrodes. The back electrode is disposed under the carrier substrate.

Preferably, the near-infrared vertical-cavity surface-emitting laser of the present invention further includes a connecting metal band. The connecting metal band is disposed under each of the reflective metal layers, each of the contact metal layers, each of the trenches, and the interval between each of the trenches in order to connect the electrode of each of the light-emitting units.

Preferably, an insulating layer is disposed in each of the trenches, under the interval between each of the trenches, in the interval between every two contact metal layers, and in the interval between every two light-emitting units.

On the basis of the purpose as mentioned above, the present invention provides a transfer method for a near-infrared vertical-cavity surface-emitting laser including: (1) sequentially depositing an epitaxial layer, an etch stop layer, a n-type contact layer, a n-type distributed Bragg reflector, a n-type confining layer, an active layer, a p-type confining layer, and a p-type contact layer on a domestic substrate; (2) selectively etching the p-type contact layer to form a plurality of trenches and oxidizing each of the trenches; selectively depositing a contact metal layer at every interval on the p-type contact layer between each trench; defining a light-emitting unit at every two trenches; partially depositing a complex Bragg reflector on each of the trenches, on an interval between each of the trenches, and between each of the contact metal layers; (3) sequentially depositing an adhesive layer and a barrier layer on each of the trenches, an interval of each of the trenches, each of the contact metal layers, and each of the complex Bragg reflectors, and depositing a bonding metal layer on the barrier layer to form a connecting metal band; (4) adhering a carrier substrate to the bonding metal layer to form a laminated structure, removing the domestic substrate, the epitaxial layer, and the etch stop layer, and turning over the laminated structure. Through this transfer method, the near-infrared vertical-cavity surface-emitting laser of the present invention may be successfully transferred to the carrier substrate with better heat dissipation. In doing so, the present invention can still be in operation when emitting a high-power laser.

Preferably, each of the complex Bragg reflectors includes a Bragg reflector and a reflective metal layer. The Bragg reflector is disposed on the p-type contact layer and made of a dielectric material. The reflective metal layer is disposed on the Bragg reflector.

Preferably, the transfer method for the near-infrared vertical-cavity surface-emitting laser of the present invention further includes depositing a transparent conductive oxide layer between the complex Bragg reflector and the p-type contact layer.

Preferably, each of the complex Bragg reflectors includes a first Bragg reflector, a second Bragg reflector, and a reflective metal layer. The second Bragg reflector is disposed on the transparent conductive oxide layer. The first Bragg reflector is disposed on the second Bragg reflector. The reflective metal layer is disposed on the first Bragg reflector. Both the first Bragg reflector and the second Bragg reflector are made of a dielectric material.

Preferably, the transparent conductive oxide layer includes materials based on indium tin oxide (ITO), zinc oxide (ZnO), aluminum-doped zinc oxide (AZO) or zinc tin oxide (SnZnO).

Preferably, the near-infrared vertical-cavity surface-emitting laser of the present invention further includes depositing at least one aperture layer between the p-type contact layer and the active layer and/or between the n-type distributed Bragg reflector and the active layer.

Preferably, the n-type confining layer and the p-type confining layer respectively include a spacing layer to adjust the length of the cavity, and the p-type contact layer includes a current spreading layer.

Preferably, the near-infrared vertical-cavity surface-emitting laser of the present invention further includes depositing at least one n-type metal electrode on the n-type contact layer and at least one bonding pad on the n-type metal electrode and depositing a back electrode under the carrier substrate.

As stated, the near-infrared vertical-cavity surface-emitting laser of the present invention may have one or more of the following advantages:

(1) The near-infrared vertical-cavity surface-emitting laser of the present invention allows the light generated from the active layer to resonate in the cavity so as to generate laser through the cavity formed by the n-type distributed Bragg reflector and the complex Bragg reflector and with the collocation of the n-type confining layer, the p-type confining layer, and the transparent conductive oxide layer.

(2) The combination of the plurality of dielectric Bragg reflectors and the plurality of reflective metal layers of the present invention is far simpler than the conventional Bragg reflector, thereby reducing manufacturing costs.

(3) The transfer method for the near-infrared vertical-cavity surface-emitting laser of the present invention has successfully transferred the present invention to the carrier substrate with better heat dissipation, leading to an increase in heat dissipation efficiency. In doing so, the present invention can still be in operation when emitting a high-power laser.

DESCRIPTION OF THE PREFERRED EMBODIMENTS

The advantages, features, and technical methods of the present invention are to be explained in detail with reference to the exemplary embodiments and the figures for the purpose of being more easily to be understood. Moreover, the present invention may be realized in different forms, and should not be construed as being limited to the embodiments set forth herein. Conversely, for a person skilled in the art, the embodiments provided shall make the present invention convey the scope more thoroughly, comprehensively, and completely. In addition, the present disclosure shall be defined only by the appended claims.

Figure 1:
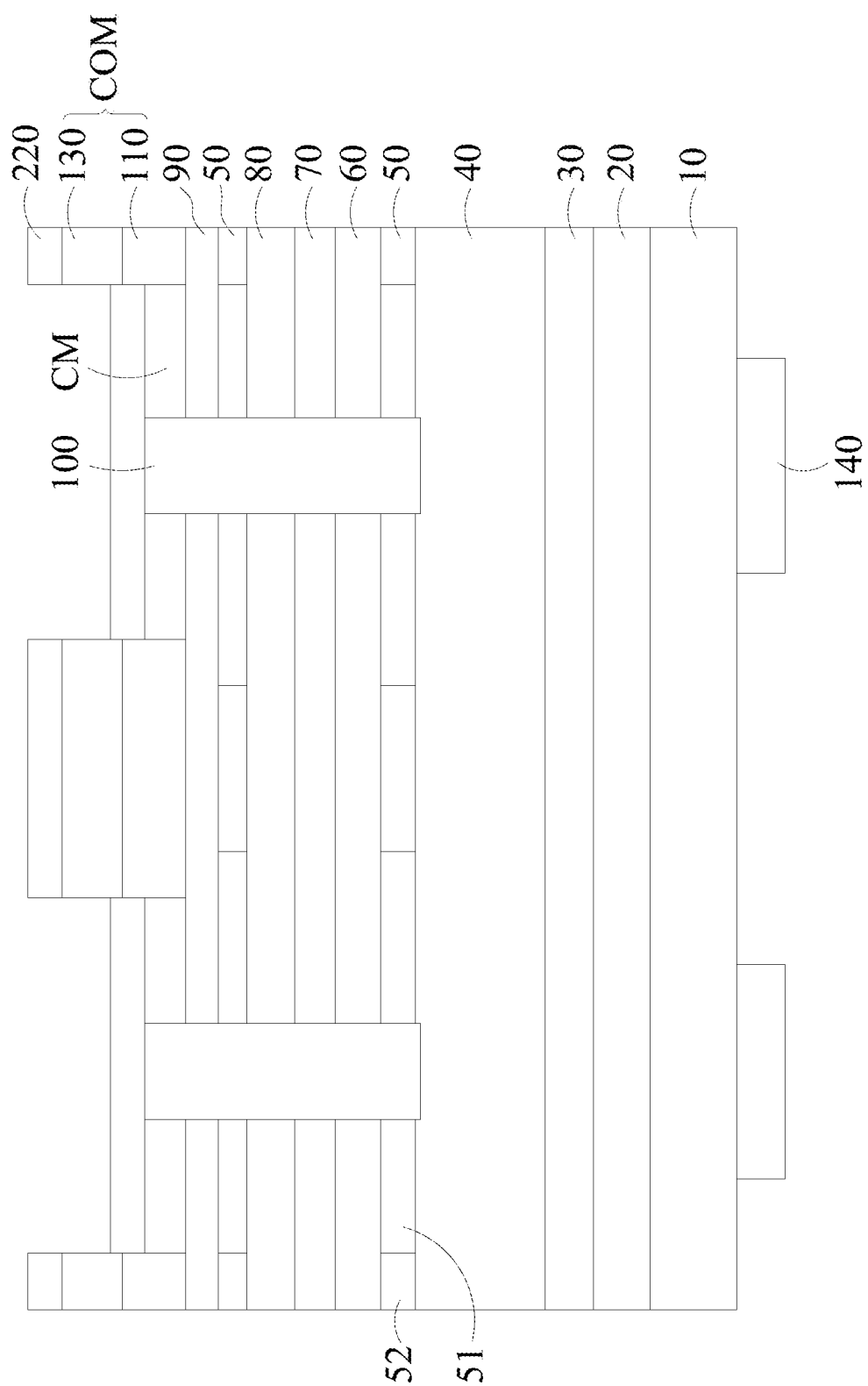
FIG. 1 depicts a structural diagram of the first embodiment according to the near-infrared vertical-cavity surface-emitting laser of the present invention.

Refer to FIG. 1, which depicts a structural diagram of the first embodiment according to the near-infrared vertical-cavity surface-emitting laser of the present invention. In this embodiment, the present invention provides a near-infrared vertical-cavity surface-emitting laser including a domestic substrate 10, an epitaxial layer 20, a n-type contact layer 30, a n-type distributed Bragg reflector 40, a n-type confining layer 60, an active layer 70, a p-type confining layer 80, a p-type contact layer 90, at least one trench 100, a complex Bragg reflector COM, a contact metal layer CM, a connecting metal band 220, and a back electrode 140. The stacking order of the domestic substrate 10 to the p-type contact layer 90 of the near-infrared vertical-cavity surface-emitting laser is from the domestic substrate 10 to the p-type contact layer 90. The n-type confining layer 60 and the p-type confining layer 80 respectively include a spacing layer to adjust the length of the cavity, and the p-type contact layer 90 includes a current spreading layer. Each of the trenches 100 is alternately disposed in the p-type contact layer 90. Every two of each of the trenches 100 define a light-emitting unit, and each of the light-emitting units forms a two-dimensional array. The plurality of complex Bragg reflectors COM are disposed on the p-type contact layer 90, and each of the plurality of complex Bragg reflectors COM is alternately disposed between each of the trenches 100. The plurality of contact metal layers CM are disposed on the p-type contact layer 90, and each of the contact metal layers CM is disposed between each of the trenches 100 and each of the complex Bragg reflectors COM. The connecting metal band 220 is disposed on each of the reflective metal layers 130, each of the contact metal layers CM, each of the trenches 100, and the interval between each of the trenches 100 in order to connect the electrode of each of the light-emitting units. The back electrode 140 is disposed under the domestic substrate 10. The light-emitting area of the present invention is confined through the cavity formed by the n-type distributed Bragg reflector 40 and the complex Bragg reflector COM and with the collocation of the n-type confining layer 60 and the p-type confining layer 80, which allows the light generated from the active layer 70 to resonate in the cavity so as to generate laser.

Wherein, the complex Bragg reflector COM includes a Bragg reflector 110 and a reflective metal layer 130. The Bragg reflector 110 is disposed on the p-type contact layer 90 and made of a dielectric material. The reflective metal layer 130 is disposed on the Bragg reflector 110.

It is worth mentioning that when the domestic substrate 10 is thinned or removed, the connecting metal band 220 may be thickened as a supporting structure for the near-infrared vertical-cavity surface-emitting laser of the present invention. At least one aperture layer 50 is respectively disposed between the p-type contact layer 90 and the active layer 70 and/or between the n-type distributed Bragg reflector 40 and the active layer 70. With the collocation of the n-type confining layer 60 and the p-type confining layer 80, the light generated from the active layer 70 is able to oscillate and resonate in the plurality of the reflective areas and the n-type distributed Bragg reflector 40. The number and position of the aperture layer 50 may be adjusted according to the requirements of the design of the semiconductor structures, which is not limited to the scope exemplified in the present invention. Specifically, a single aperture layer 50 is formed by interlacing an oxidation layer 51 and a semiconductor layer 52. The oxidation layer 51 is formed by aluminum oxide ($Al_xO_y$) and is oxidized from aluminum gallium arsenide (AlGaAs) material. The semiconductor layer 52 is formed by aluminum gallium arsenide (AlGaAs) comprising high aluminum content. The oxidation layer 51 confines the electrons and holes to recombine in the active layer 70 and also directs the emission of the laser light. The material of the active layer 70 is matched with the semiconductor layer 52, which allows the laser generated from the active layer to be emitted through the semiconductor layer 52. The width of the semiconductor layer 52 affects the aperture size of the laser. The width of the semiconductor layer 52 may be adjusted according to the requirements of the laser. Moreover, with the collocation of the n-type distributed Bragg reflector 40 and the complex Bragg reflector COM, the laser generated from the active layer 70 is emitted toward the substrate 10.

Figure 2:
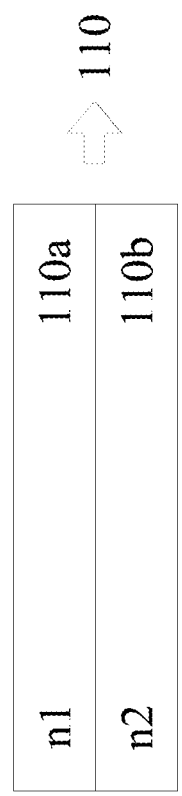
FIG. 2 depicts a structural diagram in a pair of Bragg reflector of the first embodiment according to the near-infrared vertical-cavity surface-emitting laser of the present invention.

Refer to FIG. 2, which depicts a structural diagram in a pair of Bragg reflector of the first embodiment according to the near-infrared vertical-cavity surface-emitting laser of the present invention. As shown in FIG. 2, the dielectric material of the Bragg reflector 110 includes a low refractive index layer 110a and a high refractive index layer 110b stacked with each other. The material of the high refractive index layer 110b includes tantalum pentoxide ($Ta_2O_5$), niobium pentoxide ($Nb_2O_5$), titanium dioxide ($TiO_2$), zirconium dioxide ($ZrO_2$), and hafnium oxide ($HfO_2$). The material of the low refractive index layer 110a includes magnesium fluoride ($MgF_2$), silicon oxide ($SiO_x$), calcium fluoride ($CaF_2$), barium fluoride ($BaF_2$), and aluminum oxide ($Al_xO_y$). Due to the configuration of the high refractive index layer 110b and the low refractive index layer 110a with a quarter wavelength thickness in each layer, the light is reflected when emitting light is incident on the Bragg reflector 110 stacked with multipair. According to the requirements of the reflectance of reflected light, the difference value between the refractive index n1 of the low refractive index layer 110a and the refractive index n2 of the high refractive index layer 110b may be adjusted. Only three pairs of both the low refractive index layer 110a and the high refractive index layer 110b, together with the reflective metal layer 130, are needed to achieve a reflectance of 99% or more and decrease the manufacturing costs rather than the conventional distributed Bragg reflector which requires the low refractive index layer 110a and the high refractive index layer 110b each to be more than 20 layers.

Figure 3:
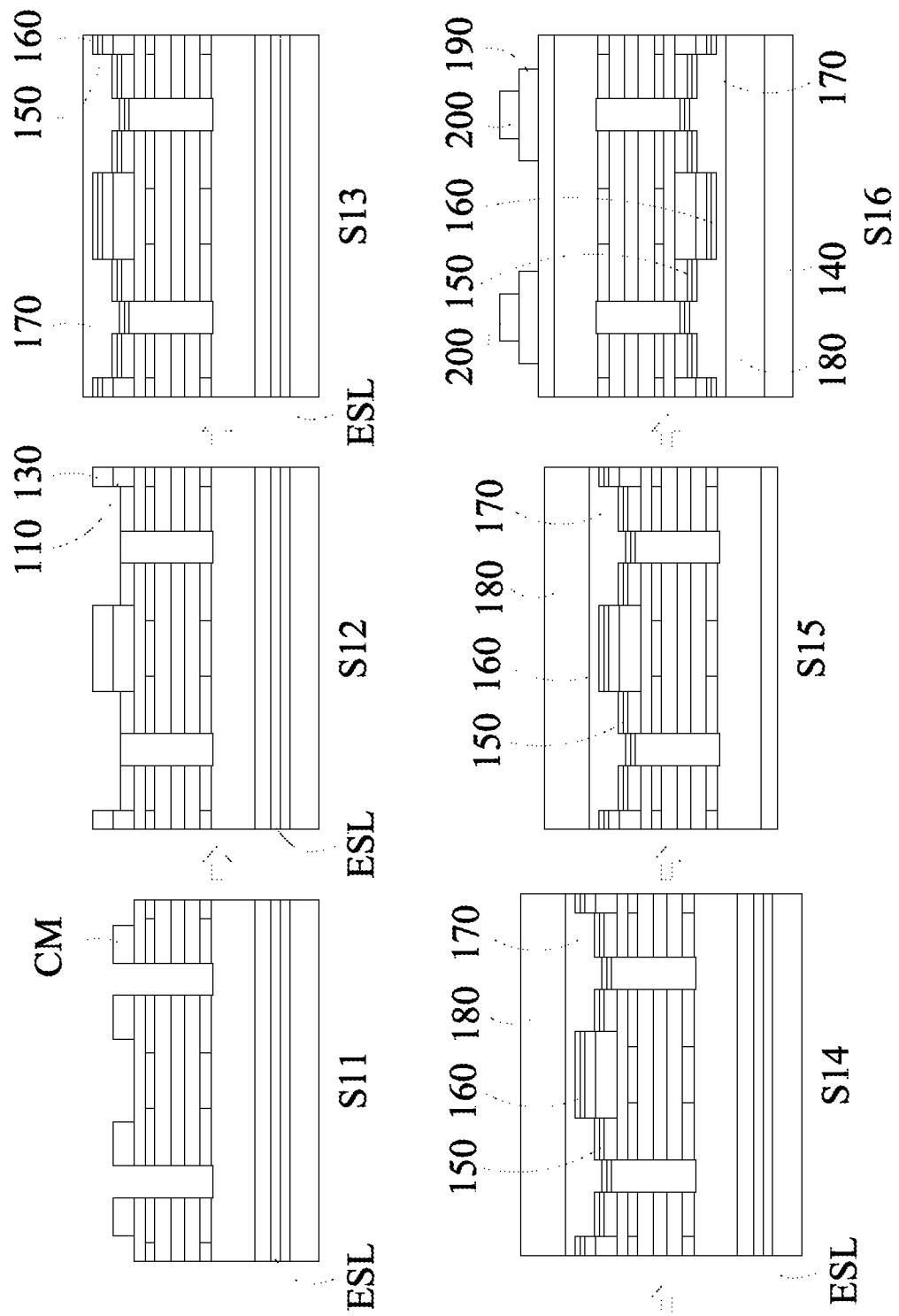
FIG. 3 depicts a flow chart of the first embodiment according to the transfer method for the near-infrared vertical-cavity surface-emitting laser of the present invention.

Refer to FIG. 3, which depicts a flow chart of the first embodiment according to the transfer method for the near-infrared vertical-cavity surface-emitting laser of the present invention. In this embodiment, the present invention provides a transfer method for a near-infrared vertical-cavity surface-emitting laser including: (1) Step S11: sequentially depositing an epitaxial layer 20, an etch stop layer ESL, a n-type contact layer 30, a n-type distributed Bragg reflector 40, an aperture layer 50, a n-type confining layer 60, an active layer 70, a p-type confining layer 80, an aperture layer 50, and a p-type contact layer 90 on a domestic substrate 10; selectively etching the p-type contact layer 90 down over the aperture 50 layer to form a plurality of trenches 100 and oxidizing each of the trenches 100; selectively depositing a contact metal layer CM at every interval on the p-type contact layer 90 between each trench 100 to define the position of each of the complex Bragg reflectors COM, wherein each of the complex Bragg reflectors COM is positioned at an intermediate symmetric area between each of the contact metal layers CM. The contact metal layer CM does not need to be close to the trench 100 like the configuration shown in FIG. 3. The spacing between the contact metal layers CM and the spacing between the trenches 100 may further be adjusted according to the requirements of the laser, although the spacing does not need to be defined. In the meantime, a light-emitting unit is defined at every two trenches 100. However, the light-emitting units do not need to be so close. The spacing between the two light-emitting units may be adjusted by the number and positions of the trenches 100, and the number and positions of the trenches 100 may be adjusted according to the requirements of laser, which is not limited to the scope of the present invention. The original state of the aperture layer 50 is a semiconductor layer 52. After the oxidation, a part of the semiconductor layer 52 is oxidized to an oxidation layer 51, which leads to the aperture layer 50 being formed by interleaving the semiconductor layer 52 and the oxidation layer 51. The laser generated from the active layer 70 is then emitted through the semiconductor layer 52. (2) Step S12: wholly depositing the Bragg reflector 110 and the reflective metal layer 130, etching the reflective metal layer 130 in the area rather than the position of the previously defined complex Bragg reflector COM, and etching the Bragg reflector 110 on the contact metal layer CM; The areas of the remaining unetched or partially etched Bragg reflector 110 acts as a current blocking layer to limit the current flow route, thereby increasing the electro-optical conversion efficiency and reducing the thermal impedance of the present invention. Wherein, the composition of the Bragg reflector 110 is also a dielectric material, and the type of the dielectric material will not be repeatedly described herein. (3) Step S13: wholly depositing an adhesive layer 150 and a barrier layer 160 to cover each of the contact metal layers CM, each of the complex Bragg reflectors COM, and each of the trenches 100, and depositing a bonding metal layer 170 on the barrier layer 160 to form a connecting metal band 220. (4) Step 14: bonding a carrier substrate 180 to the bonding metal layer 170 to form a laminated structure, wherein the carrier substrate 180 also has an adhesive layer 150, a barrier layer 160, or a bonding metal layer 170 to enhance the adhesion to the bonding metal layer 170; (5) Step S15: removing the domestic substrate 10, the epitaxial layer 20, and the etch stop layer ESL by using a suitable chemical etchant; Wherein, a mixed chemical etchant of ammonia solution ($NH_4OH$), hydrogen dioxide ($H_2O_2$), and deionized water is used for etching gallium arsenide (GaAs) and composition thereof. A mixed chemical etchant of hydrochloric acid (HCl) and phosphoric acid ($H_3PO_4$) is used for etching gallium indium phosphide (GaInP) and composition thereof. (6) Step S16: turning over the laminated structure to make the position of the n-type contact layer 30 and the position of the carrier substrate 180 interchanged; depositing at least one n-type metal electrode 190 on the n-type contact layer 30; wholly depositing dielectric insulating/passivation layer on the n-side layer rather than the n-type metal electrodes 190; depositing connecting metal band on the dielectric insulating or passivation layer rather than the position of light-emitting path in order to connect the electrode of each of the light-emitting units; depositing at least one bonding pad 200 on at least one of the n-type metal electrodes 190; lapping backside carrier substrate and depositing the back electrode 140 under the carrier substrate 180. The insulating or passivation layer on the position of light-emitting path also has a function of antireflection to enhance the output of light emission. Through the transfer method as stated above, the near-infrared vertical-cavity surface-emitting laser of the present invention is successfully transferred to the carrier substrate 180 with better heat dissipation. In doing so, the present invention can maintain operation while emitting a high-power laser.

The materials of the contact metal layer CM, the connecting metal band 220, the reflective metal layer 130, the back electrode 140, the bonding metal layer 170, the n-type metal electrode 190, and the bonding pad 200 include at least one of the following materials: indium (In), tin (Sn), aluminium (Al), gold (Au), platinum (Pt), Zinc (Zn), germanium (Ge), silver (Ag), plumbum (Pb), palladium (Pd), copper (Cu), beryllium gold (AuBe), beryllium germanium (BeGe), nickel (Ni), plumbum tin (PbSn), chromium (Cr), zinc gold (AuZn), titanium (Ti), tungsten (W), titanium tungsten (TiW), and the like. The material of the barrier layer 160 includes at least one of the following materials: nickel (Ni), platinum (Pt), molybdenum (Mo), tungsten (W), niobium (Nb), alloys thereof, and the like. The material of the adhesive layer 150 includes at least one of the following materials: titanium (Ti), aluminum (Al), chromium (Cr), Nickel (Ni), alloys thereof, and the like. The domestic substrate 10 may be doped, and selected from one of the gallium arsenide (GaAs) substrate, the indium phosphide (InP) substrate, the gallium phosphide (GaP) substrate, and the gallium arsenide phosphide (GaAsP) substrate. The carrier substrate 180 may be selected from one of the conductive silicon substrate and the other conductive material substrate. Wherein, the conductive material substrate may be made of metal materials such as copper (Cu), aluminum (Al), molybdenum (Mo), nickel (Ni), tungsten (W), and the like, or alloys thereof. The epitaxial layer 20 which may be doped, the n-type contact layer 30, the n-type distributed Bragg reflector 40, the n-type confining layer 60, the active layer 70, the p-type confining layer 80, and the p-type contact layer 90 may include at least one of the following materials: gallium arsenide (GaAs), indium gallium arsenide (InGaAs), indium gallium arsenic phosphorus (InGaAsP), aluminum gallium indium arsenide (AlGaInAs), aluminum gallium indium phosphide (AlGaInP), gallium phosphide (GaP), aluminum gallium arsenide (AlGaAs), or indium gallium nitride arsenide (InGaNAs). The etch stop layer ESL includes indium gallium phosphide (GaInP). It is needed for the epitaxial layer 20, the etch stop layer ESL, the n-type contact layer 30, the n-type distributed Bragg reflector 40, the n-type confining layer 60, the active layer 70, the p-type confining layer 80, and the p-type contact layer 90 to match the materials of the domestic substrate 10 to increase the lattice matching rate, thereby reducing the occurrence of lattice mismatch.

Figure 4:
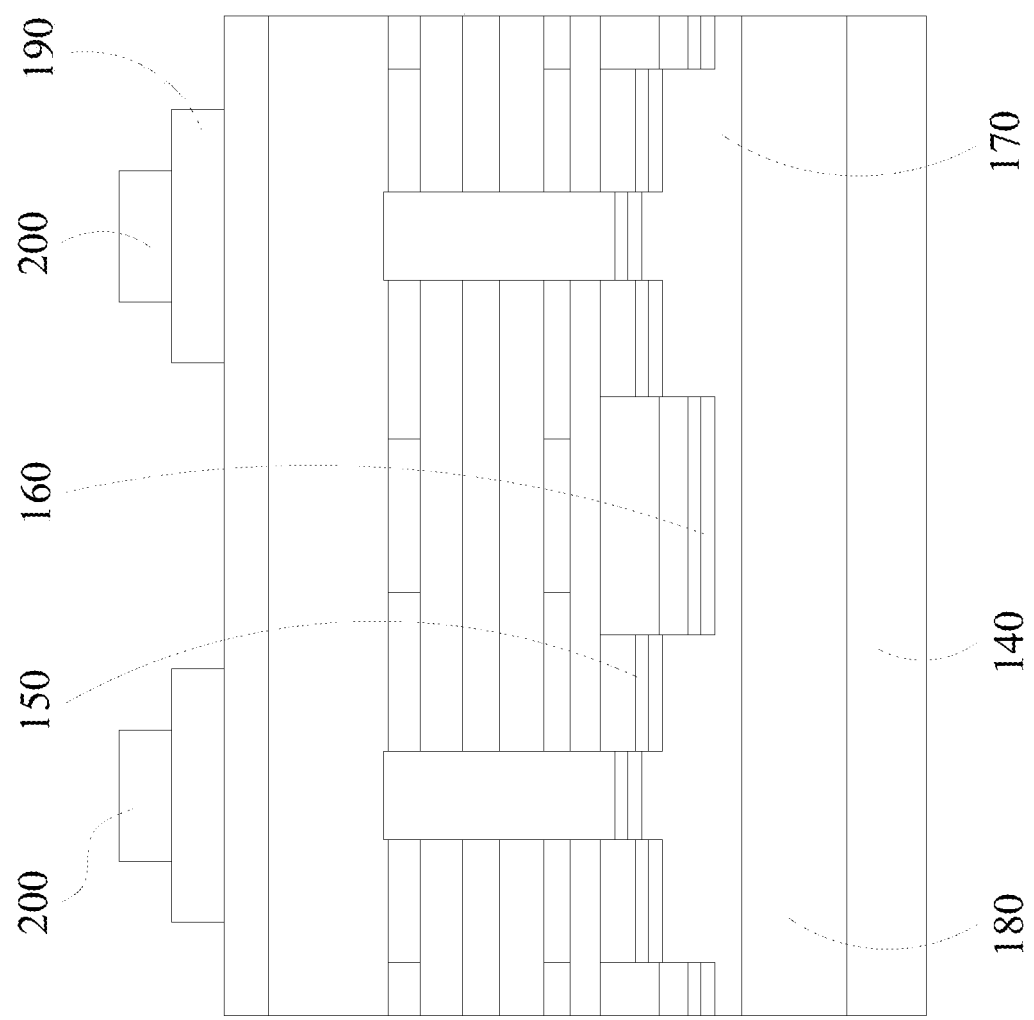
FIG. 4 depicts a structural diagram of the first embodiment after the transfer according to the near-infrared vertical-cavity surface-emitting laser of the present invention.

Refer to FIG. 4, which depicts a structural diagram of the first embodiment after the transfer according to the near-infrared vertical-cavity surface-emitting laser of the present invention. As shown in FIG. 4, the transferred near-infrared vertical-cavity surface-emitting laser of the present invention includes a carrier substrate 180, a bonding metal layer 170, a barrier layer 160, an adhesive layer 150, a plurality of complex Bragg reflectors COM, at least one trench 100, a plurality of contact metal layers CM, a plurality of semiconductor structures, a n-type distributed Bragg reflector 40, and n-type contact layer 30. The bonding metal layer 170 is disposed on the carrier substrate 180. The barrier layer 160 is disposed on the bonding metal layer 170. The adhesive layer 150 is disposed on the barrier layer 160. The plurality of complex Bragg reflectors COM are alternately disposed on the adhesive layer 150. Each of the trenches 100 is disposed between each of the complex Bragg reflectors COM. The plurality of contact metal layers CM are alternately disposed between each of the trenches 100 and each of the complex Bragg reflectors COM. The plurality of semiconductor structures SEMI are disposed between each of the trenches 100 and positioned on each of the complex Bragg reflectors COM and each of the contact metal layers CM. Each of the semiconductor structures includes a p-type contact layer 90, a p-type confining layer 80, an active layer 70, a n-type confining layer 60, and at least one aperture layer 50. The p-type contact layer 90 is disposed on each of the complex Bragg reflectors COM and each of the contact metal layers CM. The p-type confining layer 80 is disposed on the p-type contact layer. The active layer 70 is disposed on the p-type confining layer 80. The n-type confining layer 60 is disposed on the active layer 70. The aperture layer 50 is disposed between the p-type contact layer 90 and the active layer 70 and/or between the n-type distributed Bragg reflector 40 and the active layer 70. The n-type distributed Bragg reflector 40 is disposed on each of the trenches 100 and each of the semiconductor structures. The n-type contact layer 30 is disposed on the n-type distributed Bragg reflector 40.

Wherein, each of the complex Bragg reflectors COM includes a Bragg reflector 110 and a reflective metal layer 130. The Bragg reflector 110 is disposed under the p-type contact layer 90 and is made of a dielectric material. The reflective metal layer 130 is disposed under the Bragg reflector 110. In addition, the transferred near-infrared vertical-cavity surface-emitting laser of the present invention further includes at least one n-type metal electrode 190, at least one bonding pad 200, and a back electrode 140. Each of the n-type metal electrodes 190 is disposed on the n-type contact layer 30. Each of the bonding pads 200 is disposed on at least one of the n-type metal electrodes 190. The back electrode 140 is disposed under the carrier substrate 180.

Through the configuration as mentioned above, the laser generated from the active layer 70 is emitted toward a side where the n-type metal electrode 190 is disposed. Specifically, the laser generated from the active layer 70 is emitted between each of the n-type metal electrodes 190.

In addition, the transferred near-infrared vertical-cavity surface-emitting laser of the present invention further includes a connecting metal band 220. The connecting metal band 220 is disposed under each of the reflective metal layers 130, each of the contact metal layers CM, each of the trenches 100, and the interval between each of the trenches 100 to connect the electrode of each of the light-emitting units. An insulating layer is disposed in each of the trenches 100, under the interval between each of the trenches 100, in the interval between every two contact metal layers CM, and in the interval between every two light-emitting units. The connecting metal band at the n-side layer is disposed on the insulating or passivation layer to connect the n-side electrode of each of the light-emitting units. The insulating or passivation layer is disposed on the n-contact layer 30. The insulating layer or passivation layer may also include a dielectric material as described above. Redundant description is therefore omitted herein.

Figure 5:
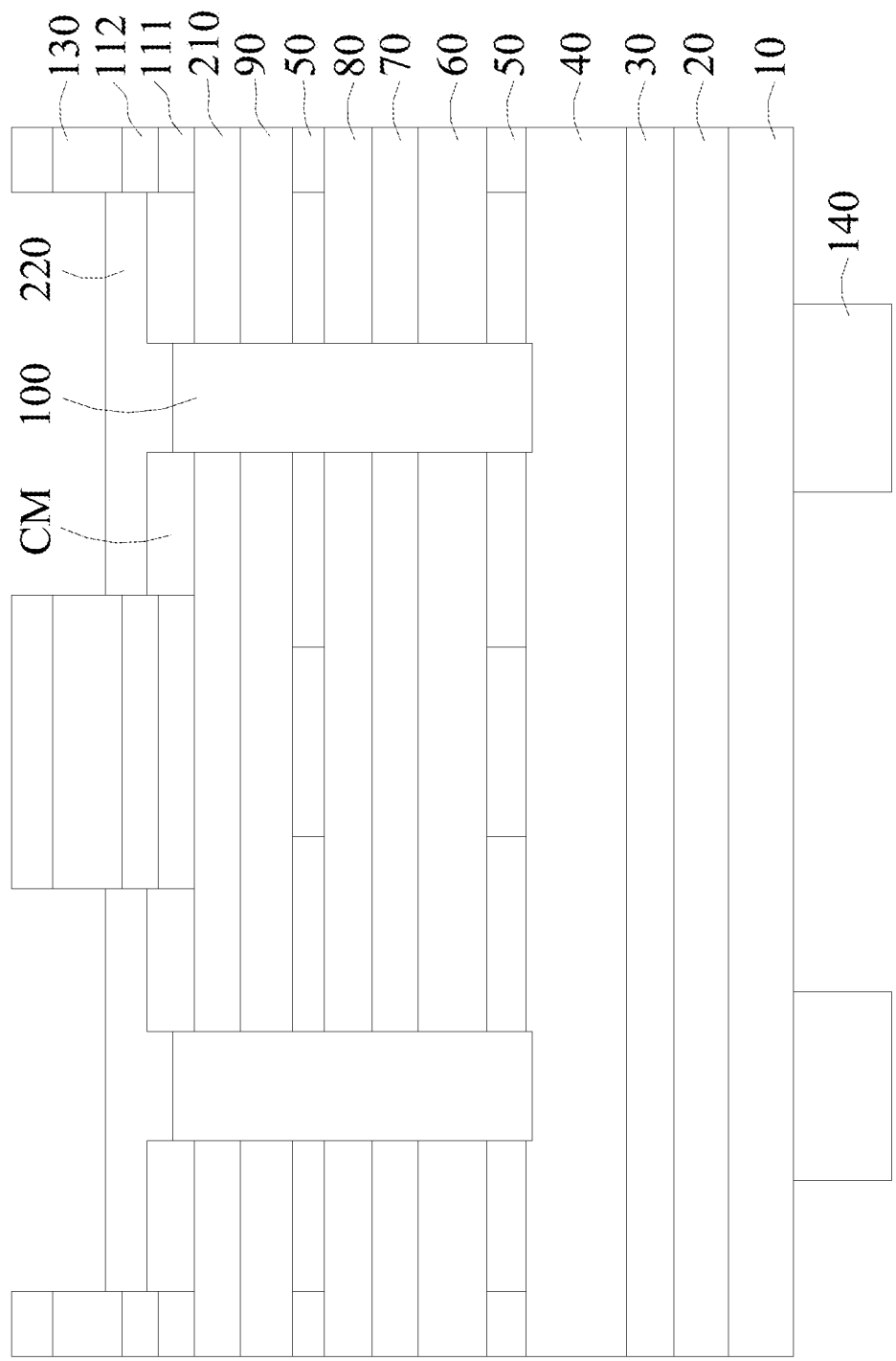
FIG. 5 depicts a structural diagram of the second embodiment according to the near-infrared vertical-cavity surface-emitting laser of the present invention.

Refer to FIG. 5, which depicts a structural diagram of the second embodiment according to the near-infrared vertical-cavity surface-emitting laser of the present invention. As shown in FIG. 5, the present invention provides a near-infrared vertical-cavity surface-emitting laser includes a domestic substrate 10, an epitaxial layer 20, a n-type contact layer 30, a n-type distributed Bragg reflector 40, an aperture layer 50, a n-type confining layer 60, an active layer 70, a p-type confining layer 80, an aperture layer 50, a p-type contact layer 90, a transparent conductive oxide layer 210, at least one trench 100, a complex Bragg reflector COM, a contact metal layer CM, a connecting metal band 220, and a back electrode 140. The stacking order of the domestic substrate 10 to the transparent conductive oxide layer 210 of the near-infrared vertical-cavity surface-emitting laser is from the domestic substrate 10 to the transparent conductive oxide layer 210. The n-type confining layer 60 and the p-type confining layer 80 respectively include a spacing layer to adjust the length of the cavity, and the p-type contact layer 90 includes a current spreading layer. Each of the trenches 100 is alternately disposed in the transparent conductive oxide layer 210. Every two of each of the trenches 100 define a light-emitting unit, and each of the light-emitting units forms a two-dimensional array. The plurality of complex Bragg reflectors COM are disposed on the transparent conductive oxide layer 210, and each of complex Bragg reflectors COM is alternately disposed between each of the trenches 100. The plurality of contact metal layers CM are disposed on the transparent conductive oxide layer 210, and each of the contact metal layers CM is disposed between each of the trenches 100 and each of the complex Bragg reflectors COM. The connecting metal band 220 is disposed on each of the reflective metal layers 130, each of the contact metal layers CM, each of the trenches 100, and the interval between each of the trenches 100 in order to connect the electrode of each of the light-emitting units. The back electrode 140 is disposed under the domestic substrate 10. The light-emitting area of the present invention is confined and the current applied to the present invention may uniformly spread to prevent the current crowding effect through the cavity formed by the n-type distributed Bragg reflector 40 and the complex Bragg reflector COM and with the collocation of the transparent conductive oxide layer 210, the n-type confining layer 60 and the p-type confining layer 80, which allows the light generated from the active layer 70 to resonate in the cavity so as to generate laser. Wherein, each of the complex Bragg reflectors COM includes a second Bragg reflector 111, a first Bragg reflector 112, and a reflective metal layer 130. The second Bragg reflector 111 is disposed on the transparent conductive oxide layer 210. The first Bragg reflector 112 is disposed on the second Bragg reflector 111. The reflective metal layer 130 is disposed on the first Bragg reflector 112. Both the first Bragg reflector 112 and the second Bragg reflector 111 are made of a dielectric material. The difference of the thicknesses between the second Bragg reflector 111 and the first Bragg reflector 112 makes the reflected wavelengths of the second Bragg reflector 111 and the first Bragg reflector 112 differ from each other. Since each of the complex Bragg reflectors COM includes a second Bragg reflector 111 and a first Bragg reflector 112, the reflectance of the complex Bragg reflector COM is larger than the reflectance of the n-type distributed Bragg reflector 40, which allows the laser generated from the active layer 70 to be emitted toward the domestic substrate 10. The transparent conductive oxide layer 210 used for the current spreading layer includes the materials based on indium tin oxide (ITO), zinc oxide (ZnO), aluminum zinc oxide (AZO), zinc tin oxide (SnZnO). These materials all have good transmittance in the visible light spectrum and the infrared light spectrum, which facilitates the emission of laser.

Similarly, when the domestic substrate 10 is thinned or removed, the connecting metal band 220 may be thickened as a supporting structure for the near-infrared vertical-cavity surface-emitting laser of the present invention. A single aperture layer 50 is formed by interlacing an oxidation layer 51 and a semiconductor layer 52. The oxidation layer 51 is made of aluminum oxide ($Al_xO_y$) and is oxidized from aluminum gallium arsenide (AlGaAs) material. The semiconductor layer 52 is made of aluminum gallium arsenide (AlGaAs) comprising high aluminum content. The oxidation layer 51 confines the electrons and holes to recombine in the active layer 70 and also confines the emitting direction of the laser light. The material of the active layer 70 is matched with the semiconductor layer 52, which allows the laser from the active layer to be emitted through the semiconductor layer 52. The width of the semiconductor layer 52 affects the aperture size of the laser. The width of the semiconductor layer 52 may be adjusted according to the requirements of the laser.

Although the terms "first" and "second" are used to describe the Bragg reflectors, the Bragg reflectors should not be limited by these terms. These terms are only used to distinguish a Bragg reflector from another Bragg reflector. Therefore, the layer order of the second Bragg reflector 111 and the first Bragg reflector 112 may be that the second Bragg reflector 111 is disposed on the first Bragg reflector 112, which is not limited to the scope of the present invention.

Figure 6:
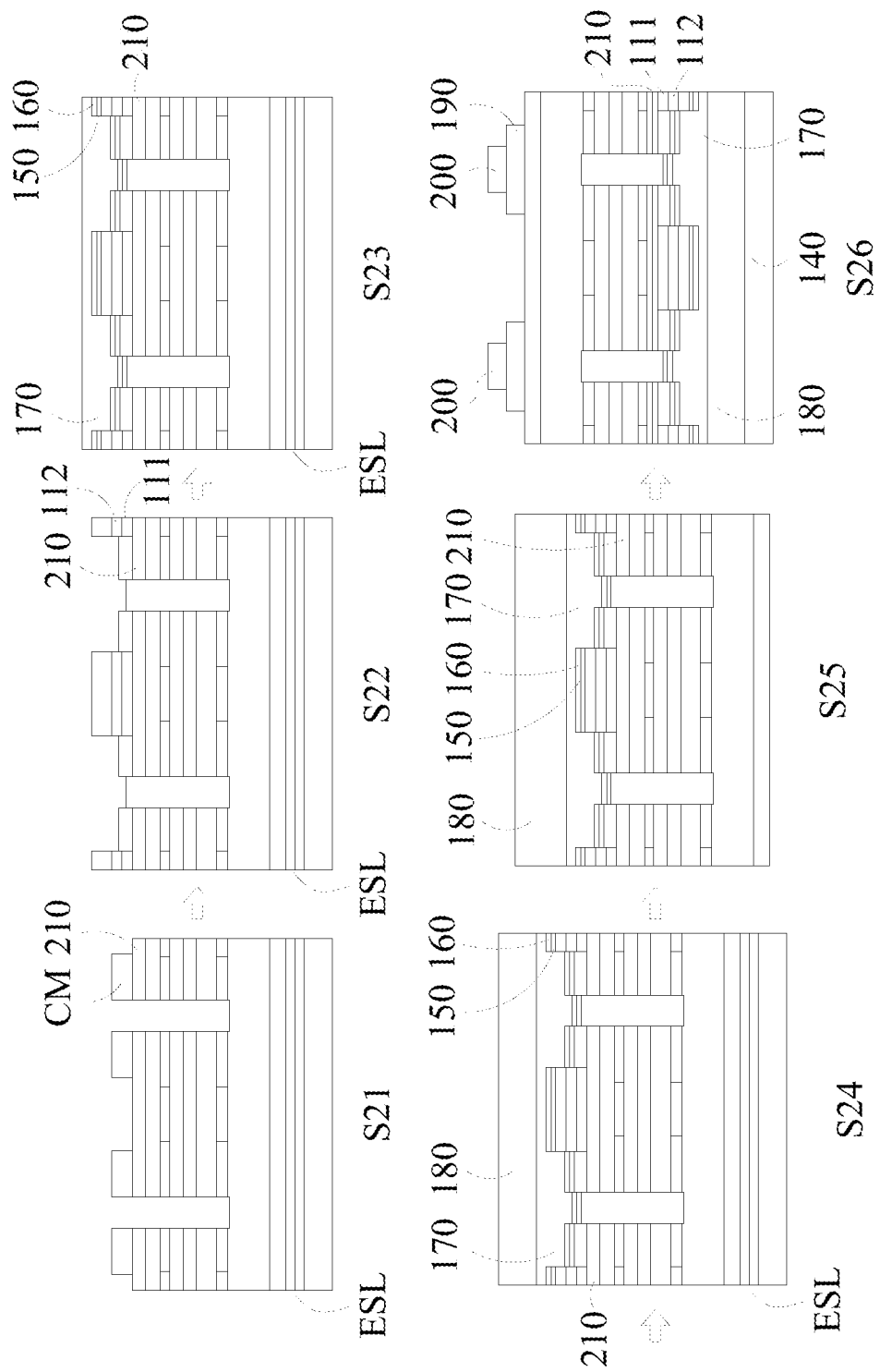
FIG. 6 depicts a flow chart of the second embodiment according to the transfer method for the near-infrared vertical-cavity surface-emitting laser of the present invention.

Refer to FIG. 6, which depicts a flow chart of the second embodiment according to the transfer method for the near-infrared vertical-cavity surface-emitting laser of the present invention. In the embodiment, the configuration of the elements with the same symbols is similar to that described above, so the similar descriptions are not to be described herein.

In this embodiment, as shown in FIG. 6, the present invention provides a transfer method for a near-infrared vertical-cavity surface-emitting laser including: (1) Step S21: sequentially depositing an epitaxial layer 20, an etch stop layer ESL, a n-type contact layer 30, a n-type distributed Bragg reflector 40, an aperture layer 50, a n-type confining layer 60, an active layer 70, a p-type confining layer 80, an aperture layer 50, a p-type contact layer 90, and a transparent conductive oxide layer 210 on a domestic substrate 10; selectively etching the transparent conductive oxide layer 210 down over an aperture layer 50 to form a plurality of trenches 100 and oxidizing each of the trenches 100; selectively depositing a contact metal layer CM at every interval on the transparent conductive oxide layer 210 between each trench 100 to define the position of each of the complex Bragg reflectors COM, wherein each of the complex Bragg reflectors COM is positioned at an intermediate symmetric area between each of the contact metal layers CM. The contact metal layer CM does not need to be close to the trench 100 like the configuration shown in FIG. 6. The spacing between the contact metal layers CM and the spacing between the trenches 100 may further be adjusted according to the requirements of the laser, although the spacing does not need to be defined. In the meantime, a light-emitting unit is defined at every two trenches 100. However, the light-emitting units do not need to be so close. The spacing between the two light-emitting units may be adjusted by the number and positions of the trenches 100, and the number and positions of the trenches 100 may be adjusted according to the requirements of laser, which is not limited to the scope of the present invention. The original state of the aperture layer 50 is a semiconductor layer 52. After the oxidation, a part of the semiconductor layer 52 is oxidized to an oxidation layer 51, which leads to the aperture layer 50 being formed by interleaving the semiconductor layer 52 and the oxidation layer 51. The laser generated from the active layer 70 is then emitted through the semiconductor layer 52. (2) Step S22: wholly depositing the second Bragg reflector 111, the first Bragg reflector 112, and the reflective metal layer 130, etching the reflective metal layer 130 in the area rather than the position of the previously defined complex Bragg reflector COM, and etching the Bragg reflector 110 on the contact metal layer CM. The areas of the remaining unetched or partially etched Bragg reflector 110 act as a current blocking layer to limit the current flow route, thereby increasing the electro-optical conversion efficiency and reducing the thermal impedance of the present invention. Wherein, the composition of the second Bragg reflector 111 and the first Bragg reflector 112 is also a dielectric material, and the type of the dielectric material will not be repeatedly described herein. (3) Step S23: wholly depositing an adhesive layer 150 and a barrier layer 160 to cover each of the contact metal layers CM, each of the complex Bragg reflectors COM, and each of the trenches 100, and depositing a bonding metal layer 170 on the barrier layer 160 to form a connecting metal band 220. (4) Step 24: bonding a carrier substrate 180 to the bonding metal layer 170 to form a laminated structure, wherein the carrier substrate 180 also has an adhesive layer 150, a barrier layer 160, or a bonding metal layer 170 to enhance the adhesion to the bonding metal layer 170. (5) Step S25: removing the domestic substrate 10, the epitaxial layer 20, and the etch stop layer ESL by using a suitable chemical etchant; wherein, a mixed chemical etchant of ammonia solution ($NH_4OH$), hydrogen dioxide ($H_2O_2$), and deionized water is used for etching gallium arsenide (GaAs) and composition thereof. A mixed chemical etchant of hydrochloric acid (HCl) and phosphoric acid ($H_3PO_4$) is used for etching gallium indium phosphide (GaInP) and composition thereof. (6) Step S26: turning over the laminated structure to make the position of the n-type contact layer 30 and the position of the carrier substrate 180 interchanged; depositing at least one n-type metal electrodes 190 on the n-type contact layer 30; wholly depositing dielectric insulating/passivation layer on the n-side layer rather than the n-type metal electrodes 190; depositing connecting metal band on the dielectric insulating or passivation layer rather than the position of light-emitting path in order to connect the electrode of each of the light-emitting units; depositing at least one bonding pad 200 on at least one of the n-type metal electrodes 190; lapping backside carrier substrate 180, and depositing the back electrode 140 under the carrier substrate 180. The insulating or passivation layer on the position of light-emitting path also has a function of antireflection to enhance the output of light emission. Through the transfer method as stated above, the near-infrared vertical-cavity surface-emitting laser of the present invention is successfully transferred to the carrier substrate 180 with better heat dissipation. In doing so, the present invention can maintain operation when emitting a high-power laser.

It should be mentioned that the purpose of the etch stop layer ESL is for the detachment of the domestic substrate 10 to prevent the n-type contact layer 30 from being affected by the detachment of the domestic substrate 10. In addition to the aforementioned etching method, it is also possible to apply other methods to detach the domestic substrate 10, which is not limited to the scope of the invention.

Figure 7:
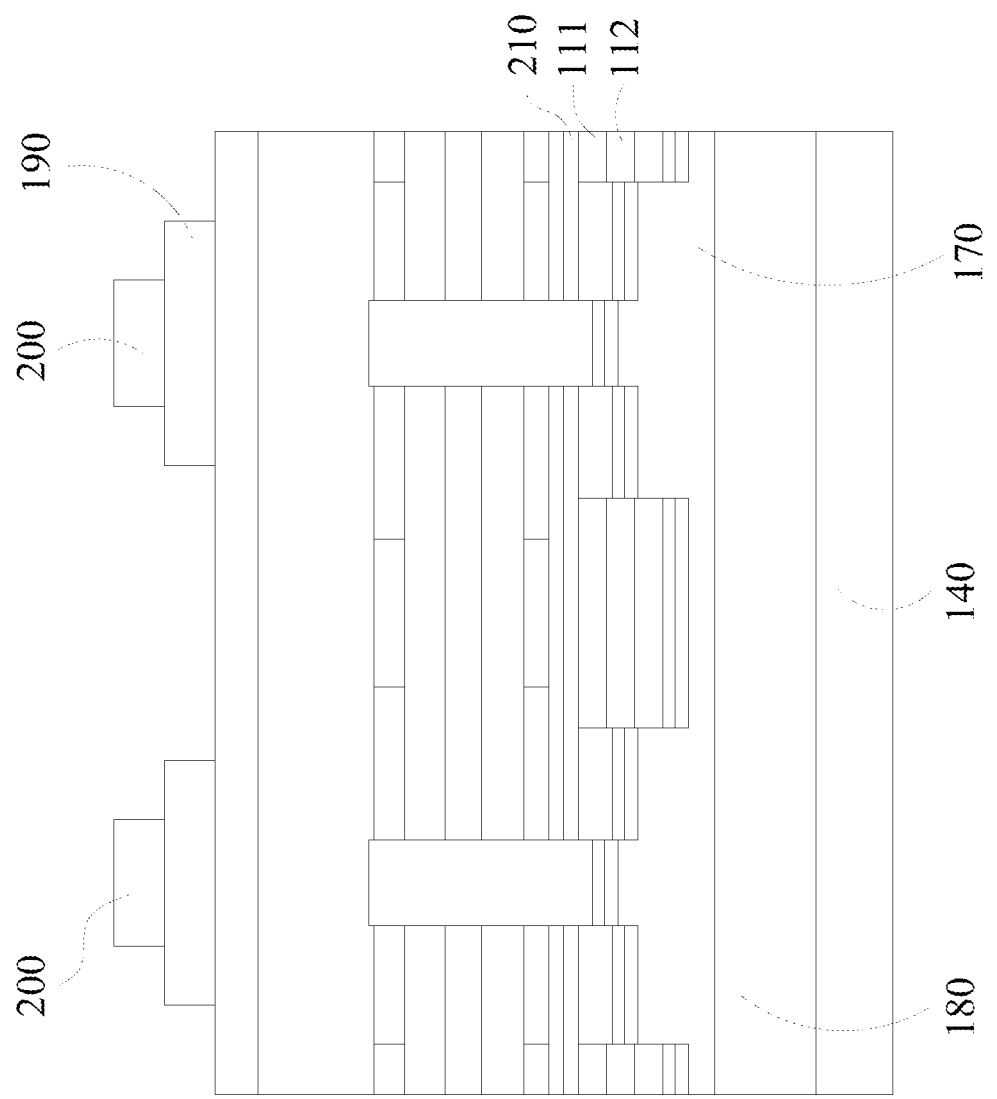
FIG. 7 depicts a structural diagram of the second embodiment after the transfer according to the near-infrared vertical-cavity surface-emitting laser of the present invention.

Refer to FIG. 7, which depicts a structural diagram of the second embodiment after the transfer according to the near-infrared vertical-cavity surface-emitting laser of the present invention. As shown in FIG. 7, the transferred near-infrared vertical-cavity surface-emitting laser of the present invention includes a carrier substrate 180, a bonding metal layer 170, a barrier layer 160, an adhesive layer 150, a plurality of complex Bragg reflectors COM, at least one trench 100, a plurality of contact metal layers CM, a plurality of semiconductor structures SEMI, a n-type distributed Bragg reflector 40, and n-type contact layer 30. The bonding metal layer 170 is disposed on the carrier substrate 180. The barrier layer 160 is disposed on the bonding metal layer 170. The adhesive layer 150 is disposed on the barrier layer 160. The plurality of complex Bragg reflectors COM are alternately disposed on the adhesive layer 150. Each of the trenches 100 is disposed between each of the complex Bragg reflectors COM. The plurality of contact metal layers CM are alternately disposed between each of the trenches 100 and each of the complex Bragg reflectors COM. The plurality of semiconductor structures SEMI are disposed between each of the trenches 100 and positioned on each of the complex Bragg reflectors COM and each of the contact metal layers CM. Each of the semiconductor structures SEMI includes a transparent conductive oxide layer 210, a p-type contact layer 90, a p-type confining layer 80, an active layer 70, a n-type confining layer 60, and at least one aperture layer 50. The transparent conductive oxide layer 210 is disposed on each of the complex Bragg reflectors COM and each of the contact metal layers CM. The p-type contact layer 90 is disposed on the transparent conductive oxide layer 210. The p-type confining layer 80 is disposed on the p-type contact layer 90. The active layer 70 is disposed on the p-type confining layer 80. The n-type confining layer 60 is disposed on the active layer 70. The aperture layer 50 is disposed between the p-type contact layer 90 and the active layer 70 and/or between the n-type distributed Bragg reflector 40 and the active layer 70. The n-type distributed Bragg reflector 40 is disposed on each of the trenches 100 and each of the semiconductor structures SEMI. The n-type contact layer 30 is disposed on the n-type distributed Bragg reflector 40.

Wherein, each of the complex Bragg reflectors COM includes a second Bragg reflector 111, a first Bragg reflector 112, and a reflective metal layer 130. The second Bragg reflector 111 is disposed under the transparent conductive oxide layer 210. The first Bragg reflector 112 is disposed under the second Bragg reflector 111. The reflective metal layer 130 is disposed under the first Bragg reflector 112. Both the second Bragg reflector 111 and the first Bragg reflector 112 are made of a dielectric material. In addition, the transferred near-infrared vertical-cavity surface-emitting laser of the present invention further includes at least one n-type metal electrode 190, at least one bonding pad 200, and a back electrode 140. Each of the n-type metal electrodes 190 is disposed on the n-type contact layer 30. Each of the bonding pads 200 is disposed on at least one of the n-type metal electrodes 190. The back electrode 140 is disposed under the carrier substrate 180.

Through the configuration as mentioned above, the laser generated from the active layer 70 is emitted toward a side where the n-type metal electrode 190 is disposed. Specifically, the laser generated from the active layer 70 is emitted between each of the n-type metal electrodes 190.

In addition, the transferred near-infrared vertical-cavity surface-emitting laser of the present invention further includes a connecting metal band 220. The connecting metal band 220 is disposed under each of the reflective metal layers 130, each of the contact metal layers CM, each of the trenches 100, and the interval between each of the trenches 100 to connect the electrode of each of the light-emitting units. An insulating layer is disposed in each of the trenches 100, in the interval between each of the trenches 100, in the interval between every two contact metal layers CM, and in the interval between every two light-emitting units. The connecting metal band at the n-side layer is disposed on the insulating or passivation layer to connect the n-side electrode of each of the light-emitting units. The insulating or passivation layer is disposed on the n-contact layer 30. The insulating or passivation layer may also include a dielectric material as described above. Redundant description is therefore omitted herein.

Figure 8:
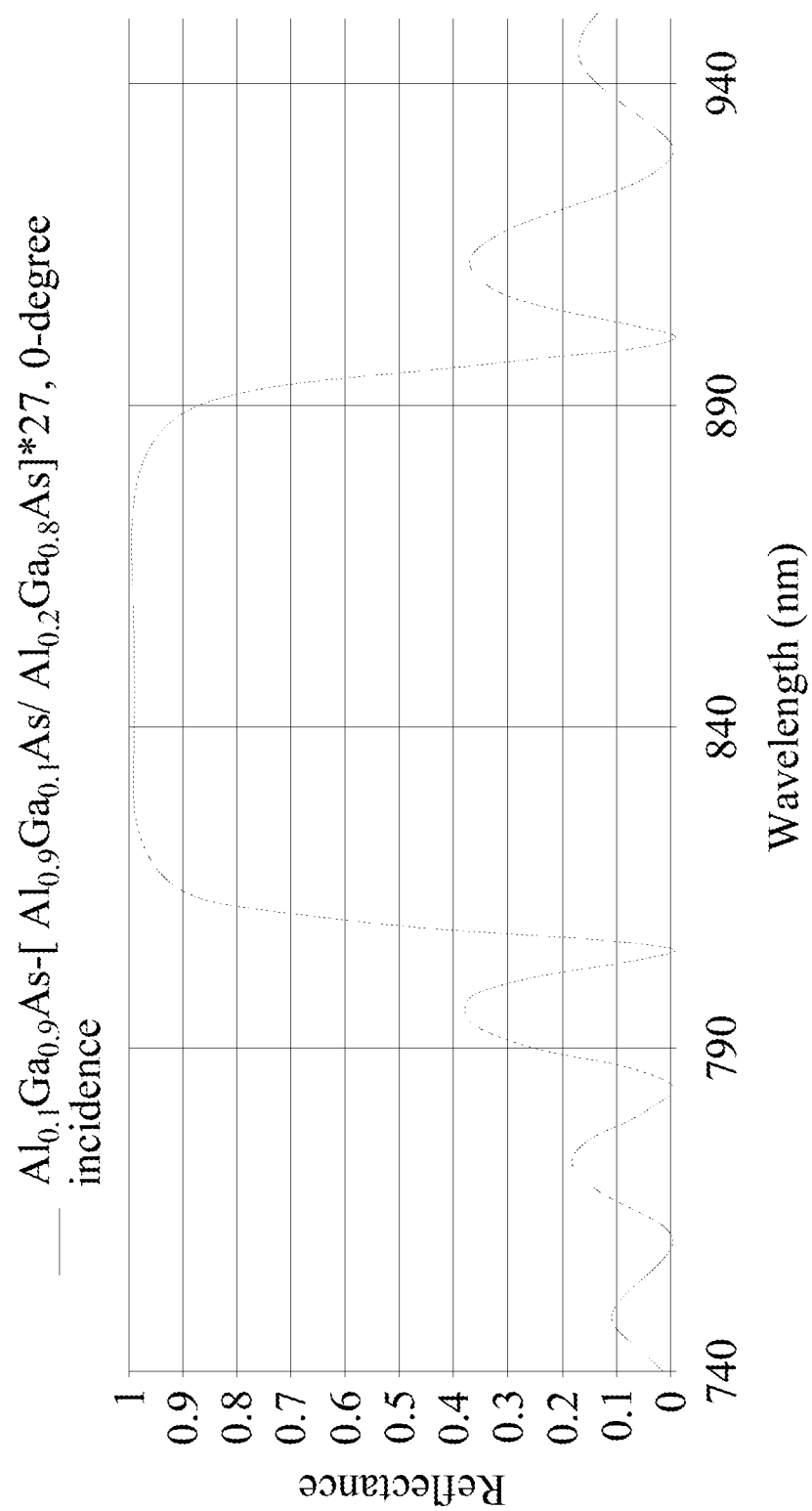
FIG. 8 depicts a simulated reflection spectrum of the conventional distributed Bragg reflector.

Refer to FIG. 8, which depicts a simulated reflection spectrum of the conventional distributed Bragg reflector. A conventional Bragg reflector includes 27 pairs of reflectors with a total thickness of 3.52 micrometers. A pair of reflectors with a quarter wavelength thickness includes an $Al_{0.9}Ga_{0.1}As$ layer and an $Al_{0.2}Ga_{0.8}As$ layer. An $Al_{0.1}Ga_{0.9}As$ layer with an equivalent refractive index medium (incident medium) is further included under the 27 pairs of reflectors. A reflectance can be calculated when the emitting light is normally incident (0-degree incidence) on 27 pairs of reflectors and reflected light is generated. The reflectance at a wavelength of 850 nm is 99.7%. When the emitting light from the $Al_{0.1}Ga_{0.9}As$ layer with the equivalent refractive index medium is incident on the 27 pairs of reflectors at an angle 15 degrees, the reflectance at a wavelength of 850 nm decreases to 89.7%.

Figure 9:
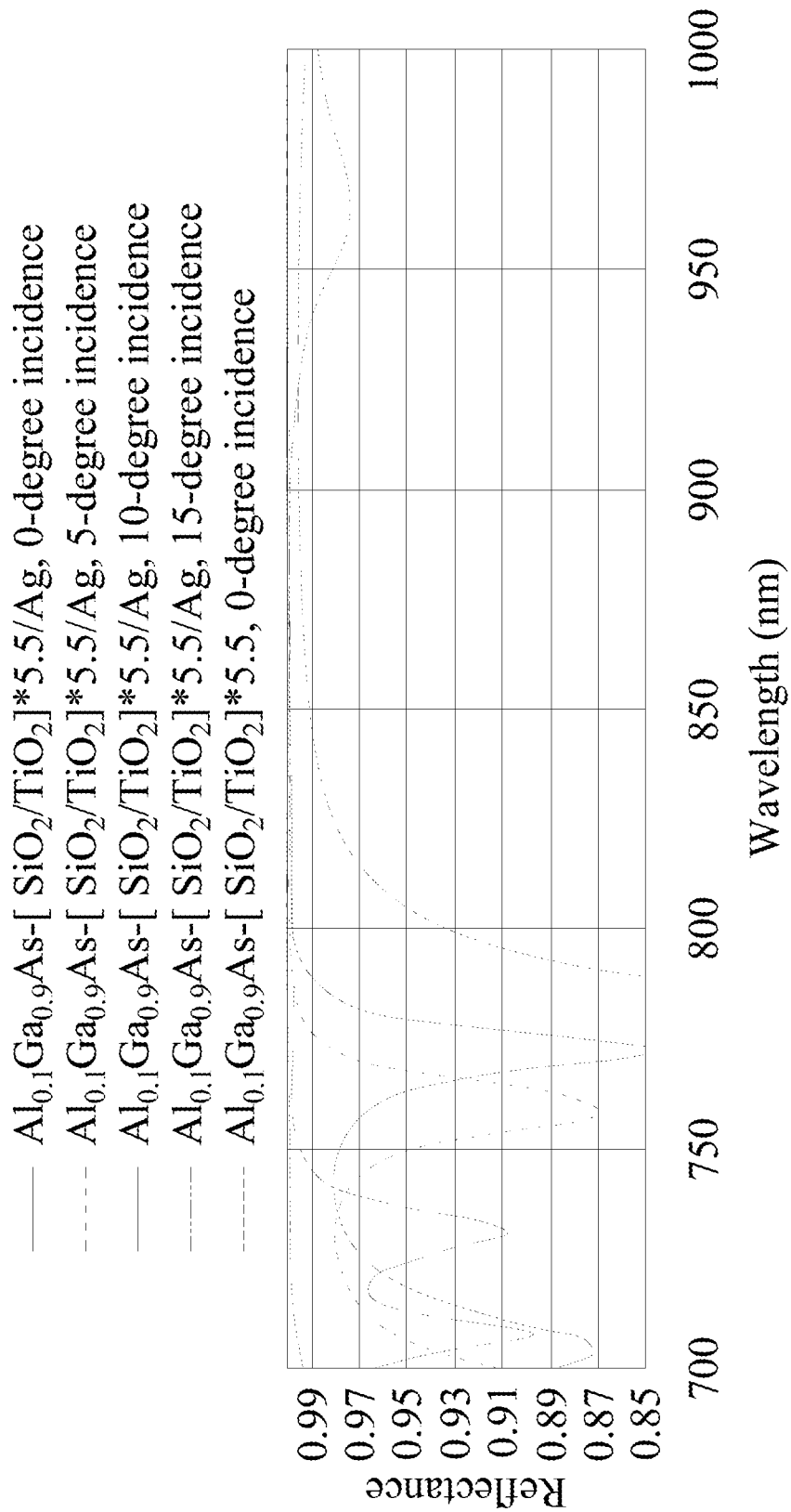
FIG. 9 depicts a simulated reflection spectrum of the complex Bragg reflector of the first embodiment according to the near-infrared vertical-cavity surface-emitting laser of the present invention.

Refer to FIG. 9, which depicts a simulated reflection spectrum of the complex Bragg reflector of the first embodiment according to the near-infrared vertical-cavity surface-emitting laser of the present invention. For simplicity, in the setting of light routes, under the condition that the domestic substrate 10, the epitaxial layer 20 and the etch stop layer ESL are removed and light is no absorption in the optical path, as shown in FIG. 4, each of the complex Bragg reflectors COM includes 5.5 pairs of Bragg reflectors 110 (thickness of 1.45 micrometers) and a reflective metal layer (Ag). An $Al_{0.1}Ga_{0.9}As$ layer with the equivalent refractive index medium (incident medium) is further included under the Bragg reflector 110. A pair of the Bragg reflectors 110 includes a silicon dioxide layer and a titanium dioxide layer. A reflectance can be calculated when the emitting light from the $Al_{0.1}Ga_{0.9}As$ layer with the equivalent refractive index medium is incident on the reflector at an incident angle from a normal incidence (0-degree incidence) to a 15-degree incidence and reflected light is generated. The reflectance at a wavelength of 850 nm is all greater than 99.9%, which is better than the reflectance of conventional distributed Bragg reflector shown in FIG. 8. It can be known from the description above that the combination of the Bragg reflector 110 with a thickness of 1.45 micrometers and the reflective metal layer 130 may meet the requirements of a high reflectance in a near-infrared light band. In addition, a reflectance test has been conducted on a Bragg reflector 110 without the reflective metal layer 130. A reflectance can be calculated when the emitting light is normally incident (0-degree incidence) on the Bragg reflector 110 and reflected light is generated. The reflectance at a wavelength of 850 nm is approximately 99%. It can be known from the description above that adding a reflective metal layer 130 may increase the reflectance of the Bragg reflector 110.

Figure 10:
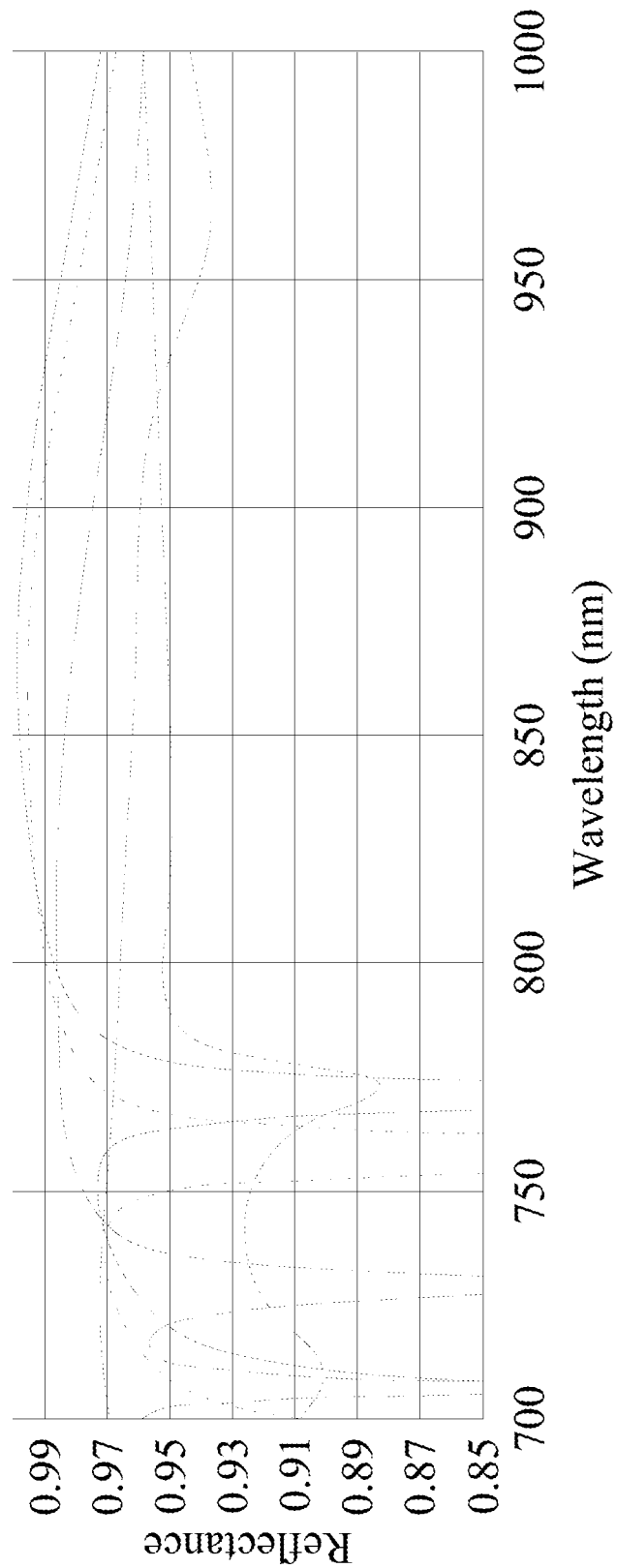
FIG. 10 depicts a simulated reflection spectrum of the complex Bragg reflector of the second embodiment according to the near-infrared vertical-cavity surface-emitting laser of the present invention.

Refer to FIG. 10, which depicts a simulated reflection spectrum of the complex Bragg reflector of the second embodiment according to the near-infrared vertical-cavity surface-emitting laser of the present invention. For simplicity, in the setting of light routes, under the condition that the domestic substrate 10, the epitaxial layer 20 and the etch stop layer ESL are removed and the light is no absorption in the optical path, as shown in FIG. 7, each of the complex Bragg reflectors COM includes a reflective metal layer (Ag), 5 pairs of first Bragg reflectors 112 (DBR1), and 2 pairs of second Bragg reflectors 111 (DBR2). A transparent oxide layer 210 (that is, the ITO layer) and an $Al_{0.1}Ga_{0.9}As$ layer with the equivalent refractive index medium (incident medium) are further included under the complex Bragg reflector COM. A pair of first Bragg reflectors (DBR1) and a pair of second Bragg reflectors (DBR2) include a silicon dioxide layer and a titanium dioxide layer. The thickness of the single pair of the first Bragg reflectors is different from the thickness of the single pair of the second Bragg reflector.

A reflectance can be calculated when the emitting light from the $Al_{0.1}Ga_{0.9}As$ layer with the equivalent refractive index medium is normally incident (0-degree incidence) on the complex Bragg reflector COM and reflected light is generated. The reflectance at a wavelength of 850 nm is greater than 99.8%. When the emitting light from the $Al_{0.1}Ga_{0.9}As$ layer with the equivalent refractive index medium is incident on the complex Bragg reflector COM at a ten-degree angle, the reflectance at a wavelength of 850 nm is still greater than 98%. It can be known from the description above that the combination of the first Bragg reflector 112, the second Bragg reflector 111, the transparent conductive oxide layer 210, and the reflective metal layer 130 may meet the requirements of a high reflectance in a near-infrared light band. In addition, a reflectance calculation has been conducted on a complex Bragg reflector COM without two pairs of second Bragg reflectors 111. A reflectance may be known when the emitting light is normally incident (0-degree incidence) on the complex Bragg reflector COM and reflected light is generated. The reflectance at a wavelength of 850 nm is approximately 95%. It can be known from the description above that adding a second Bragg reflector 111 may increase the reflectance of the complex Bragg reflector COM.

According to the aforementioned, for the near-infrared vertical-cavity surface-emitting laser of the present invention, the current applied to the present invention may uniformly spread to prevent the current crowding effect through the cavity formed by the n-type distributed Bragg reflector 40, the Bragg reflector 110 and the reflective metal layer 130 and with the configuration of the n-type confining layer 60, the p-type confining layer 80, and the transparent conductive oxide layer 210, which allows the light generated from the active layer 70 to resonate in the cavity so as to generate laser. Through the transfer method, the present invention may successfully be transferred to the carrier substrate 180 with better heat dissipation. In doing so, the present invention can maintain operation while emitting a high-power laser. In brief, the near-infrared vertical-cavity surface-emitting laser of the present invention allows the light generated from the active layer 70 to resonate in the cavity so as to generate laser light through the cavity formed by the n-type distributed Bragg reflector 40, the Bragg reflector 110, and the reflective metal layer 130. In the meantime, the total thickness of growth epitaxial layers of the present invention may be minimized.

The above description is merely illustrative rather than restrictive. Any equivalent modification or alteration without departing from the spirit and scope of the present invention should be included in the appended claims.

What is claimed is:

1. A near-infrared vertical-cavity surface-emitting laser comprising:
    a domestic substrate;
    an epitaxial layer disposed on the domestic substrate;
    a n-type contact layer disposed on the epitaxial layer;
    a n-type distributed Bragg reflector disposed on the n-type contact layer;
    a n-type confining layer disposed on the n-type distributed Bragg reflector;
    an active layer disposed on the n-type confining layer;
    a p-type confining layer disposed on the active layer;
    a p-type contact layer disposed on the p-type confining layer;
    at least one trench, each of the trenches alternately disposed in the p-type contact layer, and every two of each of the trenches defining a light-emitting unit;
    a plurality of complex Bragg reflectors disposed on the p-type contact layer and each of the plurality of complex Bragg reflectors alternately disposed between each of the trenches; and
    a plurality of contact metal layers disposed on the p-type contact layer and each of the contact metal layers disposed between each of the trenches and each of the plurality of complex Bragg reflectors.

2. The near-infrared vertical-cavity surface-emitting laser according to claim 1, wherein each of the complex Bragg reflectors comprises a Bragg reflector and a reflective metal layer, the Bragg reflector is disposed on the p-type contact layer and made of a dielectric material, and the reflective metal layer is disposed on the Bragg reflector.

3. The near-infrared vertical-cavity surface-emitting laser according to claim 1 further comprising at least one aperture layer, wherein each of the aperture layers is disposed between the p-type contact layer and the active layer and/or between the n-type distributed Bragg reflector and the active layer.

4. The near-infrared vertical-cavity surface-emitting laser according to claim 1, wherein the n-type confining layer and the p-type confining layer respectively comprise a spacing layer and the p-type contact layer comprises a current spreading layer.

5. The near-infrared vertical-cavity surface-emitting laser according to claim 2 further comprising a back electrode and a connecting metal band, wherein the back electrode is disposed under the domestic substrate, and the connecting metal band is disposed on each of the reflective metal layers, each of the contact metal layers, each of the trenches, and an interval between each of the trenches in order to connect an electrode of each of the light-emitting units.

6. The near-infrared vertical-cavity surface-emitting laser according to claim 1, wherein an insulating layer is disposed in each of the trenches and on an interval between each of the trenches.

7. A near-infrared vertical-cavity surface-emitting laser comprising:
    a domestic substrate;
    an epitaxial layer disposed on the domestic substrate;
    a n-type contact layer disposed on the epitaxial layer;
    a n-type distributed Bragg reflector disposed on the n-type contact layer;
    a n-type confining layer disposed on the n-type distributed Bragg reflector;
    an active layer disposed on the n-type confining layer;
    a p-type confining layer disposed on the active layer;
    a p-type contact layer disposed on the p-type confining layer;
    a transparent conductive oxide layer disposed on the p-type contact layer;
    at least one trench, each of the trenches alternately disposed in the transparent conductive oxide layer, and every two of each of the trenches defining a light-emitting unit;
    a plurality of complex Bragg reflectors disposed on the transparent conductive oxide layer and each of the plurality of complex Bragg reflectors alternately disposed between each of the trenches; and
    a plurality of contact metal layers disposed on the transparent conductive oxide layer and each of the contact metal layers disposed between each of the trenches and each of the plurality of complex Bragg reflectors.

8. The near-infrared vertical-cavity surface-emitting laser according to claim 7, wherein each of the complex Bragg reflectors comprises a first Bragg reflector, a second Bragg reflector, and a reflective metal layer; the first Bragg reflector is disposed on the transparent conductive oxide layer, the second Bragg reflector is disposed on the first Bragg reflector, and the reflective metal layer is disposed on the second Bragg reflector; both the first Bragg reflector and the second Bragg reflector are made of a dielectric material.

9. The near-infrared vertical-cavity surface-emitting laser according to claim 7 further comprising at least one aperture layer, wherein each of the aperture layers is disposed between the p-type contact layer and the active layer and/or between the n-type distributed Bragg reflector and the active layer.

10. The near-infrared vertical-cavity surface-emitting laser according to claim 7, wherein the n-type confining layer and the p-type confining layer respectively comprise a spacing layer and the p-type contact layer comprises a current spreading layer.

11. The near-infrared vertical-cavity surface-emitting laser according to claim 8 further comprising a back electrode and a connecting metal band, wherein the back electrode is disposed under the domestic substrate, and the connecting metal band is disposed on each of the reflective metal layers, each of the contact metal layers, each of the trenches, and an interval between each of the trenches in order to connect an electrode of each of the light-emitting units.

12. The near-infrared vertical-cavity surface-emitting laser according to claim 7, wherein the transparent conductive oxide layer comprises a material based on indium tin oxide (ITO), zinc oxide (ZnO), aluminum-doped zinc oxide (AZO), or zinc tin oxide (SnZnO).

13. The near-infrared vertical-cavity surface-emitting laser according to claim 7, wherein an insulating layer is disposed in each of the trenches and on an interval between each of the trenches.

14. A near-infrared vertical-cavity surface-emitting laser comprising:
a carrier substrate;
a bonding metal layer disposed on the carrier substrate;
a barrier layer disposed on the bonding metal layer;
an adhesive layer disposed on the barrier layer;
a plurality of complex Bragg reflector alternately disposed on the adhesive layer;
at least one trench, each of the trenches disposed between each of the complex Bragg reflectors;
a plurality of contact metal layers alternately disposed between each of the trenches and each of the complex Bragg reflectors;
a plurality of semiconductor structures disposed between each of the trenches and positioned on each of the complex Bragg reflectors and each of the contact metal layers;
a n-type distributed Bragg reflector disposed on each of the trenches and each of the semiconductor structures; and
a n-type contact layer disposed on the n-type distributed Bragg reflector.

15. The near-infrared vertical-cavity surface-emitting laser according to claim 14, wherein each of the semiconductor structures comprises a p-type contact layer, a p-type confining layer, an active layer, and a n-type confining layer; the p-type contact layer is disposed on each of the complex Bragg reflectors and each of the contact metal layers; the p-type confining layer is disposed on the p-type contact layer; the active layer is disposed on the p-type confining layer, and the n-type confining layer is disposed on the active layer.

16. The near-infrared vertical-cavity surface-emitting laser according to claim 15, wherein each of the complex Bragg reflectors comprises a Bragg reflector and a reflective metal layer, the Bragg reflector is disposed under the p-type contact layer and made of a dielectric material, and the reflective metal layer is disposed under the Bragg reflector.

17. The near-infrared vertical-cavity surface-emitting laser according to claim 14, wherein each of the semiconductor structures comprises a transparent conductive oxide layer, a p-type contact layer, a p-type confining layer, an active layer, and a n-type confining layer; the transparent conductive oxide layer is disposed on each of the complex Bragg reflectors and each of the contact metal layers; the p-type contact layer is disposed on the transparent conductive oxide layer; the p-type confining layer is disposed on the p-type contact layer; the active layer is disposed on the p-type confining layer, and the n-type confining layer is disposed on the active layer.

18. The near-infrared vertical-cavity surface-emitting laser according to claim 17, wherein each of the complex Bragg reflectors comprises a first Bragg reflector, a second Bragg reflector, and a reflective metal layer; the first Bragg reflector is disposed under the transparent conductive oxide layer; the second Bragg reflector is disposed under the first Bragg reflector; the reflective metal layer is disposed under the second Bragg reflector; both the first Bragg reflector and the second Bragg reflector are made of a dielectric material.

19. The near-infrared vertical-cavity surface-emitting laser according to claim 17, wherein the transparent conductive oxide layer comprises a material based on indium tin oxide (ITO), zinc oxide (ZnO), aluminum-doped zinc oxide (AZO), or zinc tin oxide (SnZnO).

20. The near-infrared vertical-cavity surface-emitting laser according to claim 15, further comprising at least one aperture layer, wherein each of the aperture layers is disposed between the p-type contact layer and the active layer and/or between the n-type distributed Bragg reflector and the active layer.

21. The near-infrared vertical-cavity surface-emitting laser according to claim 15, wherein the n-type confining layer and the p-type confining layer respectively comprise a spacing layer and the p-type contact layer comprises a current spreading layer.

22. The near-infrared vertical-cavity surface-emitting laser according to claim 15, further comprising a connecting metal band, wherein the connecting metal band is disposed under each of the reflective metal layers, each of the contact metal layers, each of the trenches, and an interval between each of the trenches; an insulating layer is disposed in each of the trenches and on an interval between each of the trenches.

23. The near-infrared vertical-cavity surface-emitting laser according to claim 17, further comprising at least one aperture layer, wherein each of the aperture layers is disposed between the p-type contact layer and the active layer and/or between the n-type distributed Bragg reflector and the active layer.

24. The near-infrared vertical-cavity surface-emitting laser according to claim 17, wherein the n-type confining layer and the p-type confining layer respectively comprise a spacing layer and the p-type contact layer comprises a current spreading layer.

25. The near-infrared vertical-cavity surface-emitting laser according to claim 17, further comprising a connecting metal band, wherein the connecting metal band is disposed under each of the reflective metal layers, each of the contact metal layers, each of the trenches, and an interval between each of the trenches; an insulating layer is disposed in each of the trenches and on an interval between each of the trenches; the connecting metal band at the n-side layer is disposed on the insulating layer or a passivation layer to connect the n-side electrode of the near-infrared vertical-cavity surface-emitting laser; the insulating layer or a passivation layer is disposed on the n-type contact layer.

26. The near-infrared vertical-cavity surface-emitting laser according to claim 14, further comprising at least one n-type metal electrode, at least one bonding pad, and a back electrode, wherein each of the n-type metal electrodes is disposed on the n-type contact layer, each of the bonding pads is disposed on at least one the n-type metal electrodes, and the back electrode is disposed under the carrier substrate.

27. A transfer method for a near-infrared vertical-cavity surface-emitting laser comprising:
sequentially depositing an epitaxial layer, an etch stop layer, a n-type contact layer, a n-type distributed Bragg reflector, a n-type confining layer, an active layer, a p-type confining layer, and a p-type contact layer on a domestic substrate;
selectively etching the p-type contact layer to form a plurality of trenches and oxidizing each of the trenches; selectively depositing a contact metal layer at every interval on the p-type contact layer; defining a light-emitting unit at every two trenches; partially depositing a complex Bragg reflector on each of the trenches, on an interval between each of the trenches, and between each of the contact metal layers;
sequentially depositing an adhesive layer and a barrier layer on each of the trenches, an interval of each of the trenches, each of the contact metal layers, and each of the complex Bragg reflectors, and depositing a bonding metal layer on the barrier layer to form a connecting metal band; and
bonding a carrier substrate to the bonding metal layer to form a laminated structure, removing the domestic substrate, the epitaxial layer, and the etch stop layer, and turning over the laminated structure.

28. The transfer method for the near-infrared vertical-cavity surface-emitting laser according to claim 27, wherein each of the complex Bragg reflectors comprises a Bragg reflector and a reflective metal layer, the Bragg reflector is disposed on the p-type contact layer and made of dielectric a material, and the reflective metal layer is disposed on the Bragg reflector.

29. The transfer method for the near-infrared vertical-cavity surface-emitting laser according to claim 27, further comprising depositing a transparent conductive oxide layer between the complex Bragg reflector and the p-type contact layer.

30. The transfer method for the near-infrared vertical-cavity surface-emitting laser according to claim 29, wherein each of the complex Bragg reflectors comprises a first Bragg reflector, a second Bragg reflector, and a reflective metal layer; the second Bragg reflector is disposed on the transparent conductive oxide layer, the first Bragg reflector is disposed on the second Bragg reflector, and the reflective metal layer is disposed on the first Bragg reflector; both the first Bragg reflector and the second Bragg reflector are made of a dielectric material.

31. The transfer method for the near-infrared vertical-cavity surface-emitting laser according to claim 29, wherein the transparent conductive oxide layer comprises a material based on indium tin oxide (ITO), zinc oxide (ZnO), aluminum-doped zinc oxide (AZO), or zinc tin oxide (SnZnO).

32. The near-infrared vertical-cavity surface-emitting laser according to claim 27, further comprising depositing at least one aperture layer between the p-type contact layer and the active layer and/or between the n-type distributed Bragg reflector and the active layer.

33. The near-infrared vertical-cavity surface-emitting laser according to claim 27, wherein the n-type confining layer and the p-type confining layer respectively comprise a spacing layer and the p-type contact layer comprises a current spreading layer.

34. The near-infrared vertical-cavity surface-emitting laser according to claim 27 further comprising depositing at least one n-type metal electrode on the n-type contact layer and at least one bonding pad on the n-type metal electrode and depositing a back electrode under the carrier substrate.

* * * * *